(12) United States Patent
Zhang et al.

(10) Patent No.: US 9,659,944 B2
(45) Date of Patent: May 23, 2017

(54) ONE TIME PROGRAMMABLE MEMORY WITH A TWIN GATE STRUCTURE

(71) Applicant: Avago Technologies General IP (Singapore) Pte. Ltd., Singapore (SG)

(72) Inventors: Qintao Zhang, Tustin, CA (US); Mei Xue, Irvine, CA (US); Wenwei Yang, Lake Forest, CA (US); Akira Ito, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/871,792

(22) Filed: Sep. 30, 2015

(65) Prior Publication Data

US 2017/0005103 A1  Jan. 5, 2017

Related U.S. Application Data (60) Provisional application No. 62/187,089, filed on Jun. 30, 2015.

(51) Int. Cl.
  *H01L 27/112* (2006.01)
  *G11C 17/16* (2006.01)
  *G11C 17/18* (2006.01)

(52) U.S. Cl.
  CPC ........ *H01L 27/11233* (2013.01); *G11C 17/16* (2013.01); *G11C 17/18* (2013.01)

(58) Field of Classification Search
  CPC .......................... G11C 17/16; H01L 27/11233
  USPC ........................................................... 365/96
  See application file for complete search history.

(56) References Cited

U.S. PATENT DOCUMENTS

| 6,611,452 | B1 * | 8/2003 | Han | G11C 7/14 365/159 |
|---|---|---|---|---|
| 7,038,943 | B2 * | 5/2006 | Kaal | G11C 11/404 365/174 |
| 9,076,791 | B1 * | 7/2015 | Chi | H01L 29/513 |
| 2008/0106953 | A1 * | 5/2008 | Madurawe | G11C 11/412 365/189.05 |
| 2008/0246098 | A1 * | 10/2008 | Kurjanowicz | G11C 17/16 257/408 |
| 2010/0091572 | A1 * | 4/2010 | Choi | G11C 16/0433 365/185.18 |
| 2011/0159678 | A1 * | 6/2011 | Hsu | H01L 21/82345 438/587 |
| 2012/0261758 | A1 * | 10/2012 | Lee | H01L 21/823857 257/368 |

* cited by examiner

*Primary Examiner* — Hoai V Ho
*Assistant Examiner* — Muna A Techane
(74) *Attorney, Agent, or Firm* — Sterne, Kessler, Goldstein & Fox P.L.L.C.

(57) ABSTRACT

A one-time programmable memory (OTP) is provided that includes a combined word line programming line (WL-PL). The OTP includes a programmable transistor having a first threshold voltage and a first breakdown voltage, and a pass transistor having a second threshold voltage and a second breakdown voltage. The combined WL-PL is electrically connected to respective gate electrodes of both the programmable transistor and the pass transistor so that both receive the same control voltage. The second gate electrode has a work function that is greater than that of the first gate electrode, so that the second gate breakdown voltage is greater than the first gate breakdown voltage, which enables the use of the combined WL-PL.

22 Claims, 5 Drawing Sheets

ONE TIME PROGRAMMABLE MEMORY
WITH A TWIN GATE STRUCTURE

CROSS-REFERENCE TO RELATED
APPLICATIONS

This application claims the benefit of U.S. Provisional Application No. 62/187,089, filed Jun. 30, 2015, which is incorporated herein by reference in its entirety.

BACKGROUND

Field

The present disclosure relates generally to a semiconductor device, including a semiconductor device that is configured and arranged as a one-time programmable (OTP) memory.

Background Art

In the field of data storage, there are two general types of storage devices. The first type is volatile memory in which stored information is lost when power is removed. The second type is non-volatile memory in which the information is preserved after the power is removed. There are a few different non-volatile memory technologies in the market today. The main ones include mask read only memory (ROM), floating gate, electrical fuse, and antifuse among others. Certain programmable logic devices (PLDs), such as structured application specific integrated circuits (ASICs) to provide an example, use antifuse technology to configure logic circuits to create a customized integrated circuit (IC) from a standard IC design. Antifuse technology may also be used in the field of chip IDs, security keys, memory redundancy, and MCU code memory, to provide examples.

An antifuse is an electrical device that changes from a high resistance to an electrically conductive path. The antifuse may be formed using a conventional complementary metal oxide semiconductor (CMOS) logic foundry technology, and the antifuse represents a one-time programmable (OTP) memory, because the change from the high resistance to the electrically conductive path in the antifuse is permanent and irreversible. The programming typically involves applying a programming voltage that exceeds a certain specified voltage to the antifuse to essentially "blow" the antifuse to form the electrically conductive path.

BRIEF DESCRIPTION OF THE
DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

The following Detailed Description of the present disclosure refers to the accompanying drawings that illustrate exemplary embodiments consistent with this disclosure. The exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein. Therefore, the detailed description is not meant to limit the present disclosure.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

A Conventional OTP Memory

Figure 1:
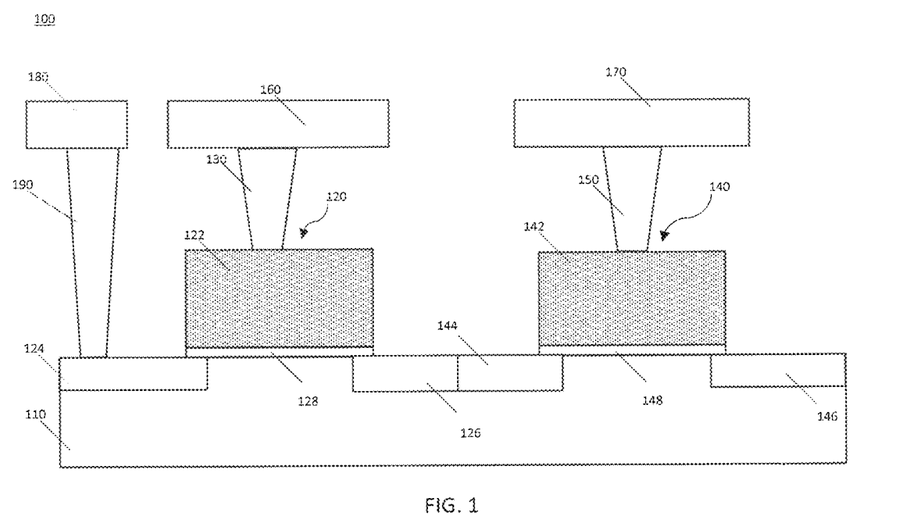
FIG. 1 illustrates a cross-sectional view of a conventional OTP memory.

FIG. 1 illustrates a cross-sectional view of a conventional OTP memory 100 fabricated using a complementary metal oxide semiconductor (CMOS) logic foundry technology. The OTP memory 100 includes a pass transistor 120 and a programmable transistor 140. The conventional CMOS logic foundry technology fabricates a conventional OTP memory 100 onto a substrate 110 of one conductivity type. The substrate 110 represents a physical material on which the CMOS logic foundry technology fabricates the conventional OTP memory 100. For example, the CMOS logic foundry technology fabricates the conventional OTP memory 100 onto the substrate 110 that is a p-type material. The p-type material includes impurity atoms of an acceptor type, such as, but not limited to, boron or aluminum to provide some examples, that are capable of accepting an electron. Doping the substrates 110 with the p-type material causes a carrier hole density in the substrates 110 to exceed a carrier electron density.

A first heavily doped region of opposite conductivity as the substrate 110 represents a pass transistor source region 124 of the conventional OTP memory 100. Generally, implanting a comparatively small number of atoms, approximately $5 \times 10^{18}$ cm$^3$ to $1 \times 10^{19}$ cm$^3$, refers to an implanting that is low or light. Similarly, implanting a comparatively large number of atoms, approximately $1 \times 10^{19}$ cm$^3$ to $5 \times 10^{20}$ cm$^3$, refers to an implanting that is high or heavy. Other doping levels can be used as will be understood by those skilled in the arts. The pass transistor source region 124 may optionally include a lightly doped source, often referred to as an LDS region. The LDS region is of substantially similar conductivity as the pass transistor source region 124 with a lesser doping density when compared to a doping density of the remainder of the pass transistor source region 124.

A second heavily doped region of opposite conductivity as the substrate 110 represents a pass transistor drain region 126 of the conventional OTP memory 100. The CMOS logic foundry technology implants the pass transistor source region 124 and the pass transistor drain region 126 with N+ material to form a first N+ region and a second N+ region corresponding to the pass transistor source region 124 and the pass transistor drain region 126, respectively. The "+" indicates that the region is implanted with a higher carrier concentration than a region not designated by a "+." For instance, an N+ region generally has a greater number of excess carrier electrons than an n-type region. A P+ region typically has a greater number of excess carrier holes than a p-type substrate. The pass transistor drain region 126 may optionally include a lightly doped drain, often referred to as an LDD region. The CMOS logic foundry may optionally implant the LDD region with n-type material having a doping density less than a doping density of the first N+ region and/or the second N+ region. The n-type material includes impurity atoms of a donor type, such as, but not limited to, phosphorus, arsenic, or antimony to provide some examples, that are capable of donating an electron. Implanting the pass transistor source region 124 and/or the pass transistor drain region 126 with the n-type material causes the carrier electron density in the pass transistor source region 124 and/or the pass transistor drain region 126 to exceed a carrier hole density.

A third heavily doped region of opposite conductivity as the substrate 110 represents a programmable transistor source region 144 of the conventional OTP memory 100. The programmable transistor source region 144 may optionally include a lightly doped source, often referred to as an LDS region. The LDS region is of substantially similar conductivity as the programmable transistor source region 144 with a lesser doping density when compared to a doping density of the remainder of the programmable transistor source region 144.

A fourth heavily doped region of opposite conductivity as the substrate 110 represents a programmable transistor 140 drain region 146 of the conventional OTP memory 100. The CMOS logic foundry technology implants the programmable transistor source region 144 and the programmable transistor drain region 146 with N+ material to form a third N+ region and a fourth N+ region corresponding to the programmable transistor source region 144 and the programmable transistor drain region 146, respectively. The programmable transistor drain region 146 may optionally include an LDD region. The CMOS logic foundry may optionally implant the LDD region with n-type material having a doping density less than a doping density of the third N+ region and/or the fourth N+ region. Implanting the programmable transistor source region 144 and/or the programmable transistor drain region 146 with the n-type material causes the carrier electron density in the programmable transistor 140 source region 144 and/or the programmable transistor 140 drain region 146 to exceed a carrier hole density.

The pass transistor drain region 126 and the programmable transistor source region 144 may be abutting to form a single doped region. The single doped region may exceed the minimum size as defined by a minimum design rule (MDR) associated with the CMOS logic foundry technology. Alternatively, the pass transistor drain region 126 and the programmable transistor source region 144 may be electrically connected by an interconnect.

A pass transistor gate electrode 122 is positioned between the pass transistor source region 124 and the pass transistor drain region 126, and a programmable transistor gate electrode 142 is positioned between the programmable transistor source region 144 and the programmable transistor drain region 146. A pass transistor gate dielectric 128 is interposed between the pass transistor gate electrode 122 and the substrate 110, and a programmable transistor gate dielectric 148 is interposed between the programmable transistor gate electrode 142 and the substrate 110.

The pass transistor gate electrode 122 and the programmable transistor gate electrode 142 are typically made of the same gate material. This gate material may be metal. For example, this gate material may be an aluminum alloy with a work function ranging from 4.05 eV to 4.61 eV or element aluminum with a work function about 4.08 eV or titanium nitride with a work function ranging from 4.61 eV to 5.17 eV. Thus, a first work function of the pass transistor gate electrode 122 and a second work function of the programmable transistor gate electrode 142 may be substantially the same. Herein, a work function of a material is defined as the minimum energy required to extract an electron from the surface of the material to free space.

The pass transistor gate dielectric 128 and the programmable transistor gate dielectric 148 may be made of the same material and may have substantially the same thickness, and a first threshold voltage and a first gate dielectric breakdown voltage of the pass transistor 120 may be substantially the same as a second threshold voltage and a second gate dielectric breakdown voltage of the programmable transistor 140. The first and second threshold voltages may be, for example, between 0.3 V and 0.8 V. The first and second gate dielectric breakdown voltages may be, for example, between 4 V and 8 V.

The pass transistor gate dielectric 128 and the programmable transistor gate dielectric 148 may be formed using a conventional dielectric material such as, but not limited to, silicon dioxide ($SiO_2$). The pass transistor gate dielectric 128 and the programmable transistor gate dielectric 148 may also be formed using a high-k dielectric such as, but not limited to, hafnium oxide ($HfO_2$). The pass transistor gate dielectric 128 and the programmable transistor gate dielectric 148 may be deposited using physical vapor deposition (PVD), chemical vapor deposition (CVD), atomic layer deposition (ALD), or any other suitable method of deposition. The pass transistor gate dielectric 128 and the programmable transistor gate dielectric 148 may have thicknesses ranging from 0.5 nm to 2.0 nm.

A word line 160 is electrically connected to the pass transistor gate electrode 122. A programming line 170 is electrically connected to the programmable transistor gate electrode 142. A bit line 180 is electrically connected to the pass transistor source region 124. The word line 160 is electrically connected to the pass transistor gate electrode 122 through a pass transistor contact 130. The programming line 170 is electrically connected to the pass transistor gate electrode 122 through a programmable transistor contact 150. The bit line 180 is electrically connected to the pass transistor source region 124 through a pass transistor source region contact 190. A first horizontal spacing between the word line 160 and the programming line 170 and a second horizontal spacing between the word line 160 and the bit line 180 may be the same as or greater than the minimum spacing defined by a MDR associated with the CMOS logic foundry technology.

The conventional OTP memory 100 may be in a programmed state or an unprogrammed state. During a read operation, the bit line 180, which is electrically floating and pre-discharged, becomes charged if the conventional OTP memory 100 is in a programmed state, while the bit line 180 remains discharged if the conventional OTP memory 100 is in an unprogrammed state. A sense amplifier can be used to detect the potential change in the bit line 180.

Programming Operation on a Conventional OTP Memory

The conventional OTP memory 100 may be programmed by driving the word line 160 to a first potential, such as a first positive direct current (DC) voltage to provide an example, and by driving the bit line 180 to a second potential, such as a ground potential to provide an example. As described above, the word line 160 and the pass transistor gate electrode 122 are electrically connected, and the bit line 180 and the pass transistor source region 124 are electrically connected. Thus, a voltage appears between the pass transistor gate electrode 122 and the pass transistor source region 124.

When this voltage is greater than the first threshold voltage of the pass transistor 120, the first potential on the pass transistor gate electrode 122 repels carriers from a bottom side of the pass transistor gate electrode 122 to form a first channel. The first channel represents a carrier-depletion region populated by a negative charge formed at a bottom side of the pass transistor gate electrode 122 by an electric field. This electric field also attracts carriers from the pass transistor source region 124 and the pass transistor drain region 126 into the first channel. The first channel eventually connects the pass transistor source region 124 to the pass transistor drain region 126 after a sufficient number of carriers have accumulated in the carrier-depletion region allowing a current to pass through the first channel. As a result of the formed first channel, the pass transistor drain region 126 and the programmable transistor source region 144 have substantially the same potential as the second potential (e.g., a ground potential in this example).

Additionally, the programming line 170 (and the programmable transistor gate electrode 142) is driven to a third potential, such as a second positive DC voltage that is greater than the first positive DC voltage, which causes a voltage to appear between the programmable transistor gate electrode 142 and the programmable transistor gate source region 144. When this voltage is greater than a second breakdown voltage of the programmable transistor 140, the programmable transistor gate dielectric 148 disintegrates or "blows." The conventional OTP memory is considered to be in a programmed state once the programmable transistor gate dielectric 148 is disintegrated or "blown."

Read Operation on a Conventional OTP Memory

The conventional OTP memory 100 may be read by driving the word line 160 to the first potential, such as the first positive DC voltage to provide an example, and by pre-discharging the bit line 180 to be at a fourth potential, such as a ground potential to provide an example. The bit line 180 may be electrically floating after it is pre-discharged. As described above, the word line 160 and the pass transistor gate electrode 122 are electrically connected, and the bit line 180 and the pass transistor source region 124 are electrically connected. Thus, a voltage appears between the pass transistor gate electrode 122 and the pass transistor 120 source region 124.

When this voltage exceeds the first threshold voltage of the pass transistor 120, the first potential on the pass transistor gate electrode 122 repels carriers from a bottom side of the pass transistor gate electrode 122 to form a first channel, as described above. As a result of the formed first channel, the pass transistor drain region 126 and the programmable transistor source region 144 have substantially the same potential as the fourth potential (e.g., a ground potential). A fifth potential, such as a third positive DC voltage that is substantially the same as the first positive DC voltage, may be applied to the programming line 170 (and the programmable transistor gate electrode 142), which causes a voltage to appear between the programmable transistor gate electrode 142 and the programmable transistor gate source region 144.

When this voltage is greater than the second threshold voltage of the programmable transistor 140 and the conventional OTP memory 100 is in an unprogrammed state, a second channel is formed between the programmable transistor source region 144 and the programmable transistor 140 drain region 146. However, since the programmable transistor 140 drain region 146 is electrically floating, the bit line 180 remains at a potential substantially the same as the fourth potential (e.g., ground potential).

When the conventional OTP memory 100 is in a programmed state, a resistive path is created between the programmable transistor gate electrode 142 and the programmable transistor source region 144. Thus, current flows between the bit line 180 and the programming line 170 through the first channel and begins charging the floating bit line 180. The potential change in the bit line 160 may be sufficiently large for a sensor amplifier connected to the bit line 160 to detect.

Impact of Transistor Scaling on the Conventional OTP Memory

Advances in semiconductor manufacturing technologies have resulted in dramatically increased circuit packing densities and higher speeds of operation. In order to achieve such increased densities, a wide variety of evolutionary changes have taken place with respect to semiconductor processing techniques and semiconductor device structures over the years.

Many of these process and structural changes have been introduced in connection with device scaling, in which ever smaller device geometries have been achieved. One consequence of conventional FET device scaling is a requirement to reduce operating voltages. The reduced operating voltages are required, at least in part, because conventional FET device scaling needs a thinner gate dielectric layer in order to produce the desired electrical characteristics in the scaled-down transistor. Thus, without a reduction in operating voltage, the electric field impressed across the thinner gate dielectric during circuit operation can be high enough for dielectric breakdown to become a problem.

With respect to the conventional OTP memory 100, the continued FET device scaling has led to a problem where applying a large programming voltage to the programming line 170 causes an electric field that is sufficiently strong to breakdown the neighboring pass transistor 120 gate dielectric 128. This problem is exacerbated by the reduction in the spacing between the pass transistor 120 and the programmable transistor 140 and by the thinning of the gate dielectric, as the transistors continue to scale down.

An Exemplary OTP Memory

Figure 2A:
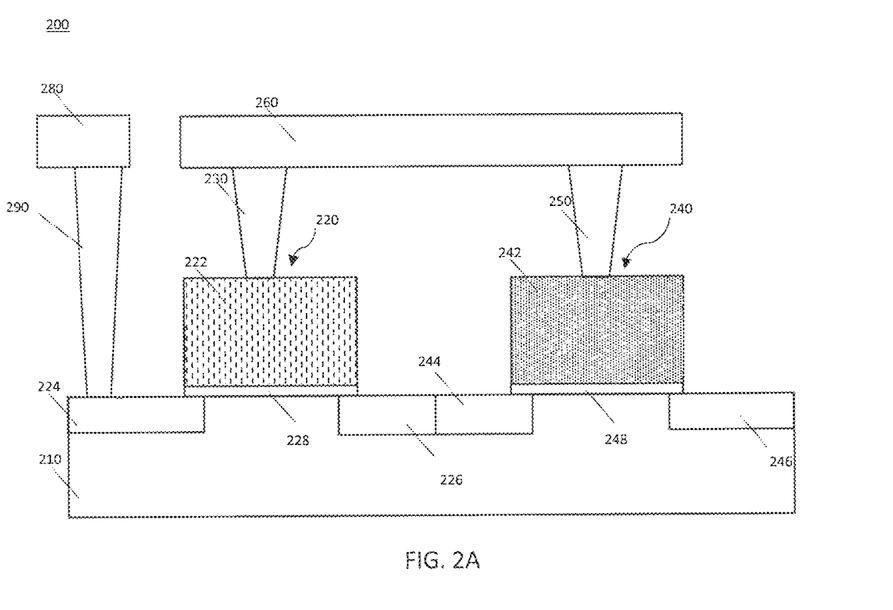
FIG. 2A illustrates a cross-sectional view of an OTP memory, in accordance with an embodiment of the present disclosure.

FIG. 2A illustrates a cross-sectional view of an OTP memory 200 fabricated according to embodiments of the present disclosure, using for example a CMOS logic foundry technology. Although, other foundry processes could be used as will be understood by those skilled in art. The OTP memory 200 includes a pass transistor 220 and a programmable transistor 240 formed on a substrate 210 of one conductivity type. The substrate 210 provides a physical material on which the OTP memory 200 is based on. For example, in the present exemplary embodiment, OTP memory substrate 210 is composed of a p-type material. Doping the substrates 210 with the p-type material causes a carrier hole density in the substrates 210 to exceed a carrier electron density. Alternatively, a fin on the substrate 210 can be fabricated including a p-type material and the OTP memory 200 can be fabricated in, or on, the fin.

A first heavily doped region having opposite conductivity as that of the substrate 210 forms a pass transistor source region 224 of the OTP memory 200. The pass transistor source region 224 may optionally include a lightly doped source, often referred to as an LDS region. The LDS region is of substantially similar conductivity as the pass transistor source region 224 with a lesser doping density when compared to a doping density of the remainder of the pass transistor source region 224.

A second heavily doped region of opposite conductivity as the substrate 210 represents a pass transistor drain region 226 of the OTP memory 200. The pass transistor source region 224 and the pass transistor drain region 226 may be implanted with N+ material to form a first N+ region and a second N+ region corresponding to the pass transistor source region 224 and the pass transistor drain region 226, respectively. The pass transistor source region 226 may optionally include a lightly doped drain, often referred to as an LDD region. The LDD region may be implanted with n-type material having a doping density less than a doping density of the remainder of the first N+ region and/or the second N+ region. Implanting the pass transistor source region 224 and/or the pass transistor drain region 226 with the n-type material causes the carrier electron density in the pass transistor source region 224 and/or the pass transistor drain region 226 to exceed a carrier hole density.

A third heavily doped region of opposite conductivity as the substrate 210 represents a programmable transistor source region 244 of the OTP memory 200. The programmable transistor source region 244 may optionally include a lightly doped source, often referred to as an LDS region. The LDS region is of substantially similar conductivity as the programmable transistor source region 244 with a lesser doping density when compared to a doping density of the remainder of programmable transistor source region 244.

A fourth heavily doped region of opposite conductivity as the substrate 210 forms a programmable transistor drain region 246 of the OTP memory 200. The programmable transistor source region 244 and the programmable transistor drain region 246 can be implanted with N+ material to form a third N+ region and a fourth N+ region corresponding to the programmable transistor source region 244 and the programmable transistor drain region 246, respectively. The programmable transistor drain region 246 may optionally include an LDD region. The LDD region may be implanted with n-type material having a doping density less than a doping density of the third N+ region and/or the fourth N+ region. Implanting the programmable transistor source region 244 and/or the programmable transistor drain region 246 with the n-type material causes the carrier electron density in the programmable transistor source region 244 and/or the programmable transistor 240 drain region 246 to exceed a carrier hole density.

A pass transistor gate electrode 222 is positioned between the pass transistor source region 224 and the pass transistor drain region 226. Likewise, a programmable transistor gate electrode 242 is positioned between the programmable transistor source region 244 and the programmable transistor drain region 246. A pass transistor gate dielectric 228 is interposed between the pass transistor gate 222 and the substrate 210, and a programmable transistor gate dielectric 248 is interposed between the programmable transistor gate 242 and the substrate 210.

The pass transistor gate electrode 222 may be made of a first gate material, and the programmable transistor gate electrode 242 may be made of a second gate material. The first gate material may be a first type metal. For example, the first gate material may be titanium nitride with a first work function of about 4.7 eV. The second gate material may be a second type metal. For example, the second gate material may be an aluminum alloy with a second work function ranging from 4.05 eV to 4.61 eV or element aluminum with a work function of about 4.08 eV or titanium nitride with a work function ranging from 4.61 eV to 5.17 eV.

A first work function of the pass transistor gate electrode 222 is greater than a second work function of the programmable transistor gate electrode 242. Thus, the flat-band voltage of the pass transistor 220 is greater than the flat-band voltage of the programmable transistor 240. Moreover, a first threshold voltage of the pass transistor 220 is greater than a second threshold voltage of the programmable transistor 240, and a first breakdown voltage of the pass transistor 220 is greater than a second breakdown voltage of the programmable transistor 240. As a result, the pass transistor 220 can be biased at a higher voltage than the programmable transistor 240 without causing the pass transistor gate dielectric 228 to breakdown. Additionally, as a result of the increased flat-band voltage of the pass transistor 220, the pass transistor 220 gate dielectric 228 can withstand the strong electric field generated by the neighboring programmable transistor 240 during a programming operation.

The first threshold voltages may be, for example, between 0.6 V and 0.8V. The second threshold voltages may be, for example, between 0.3 V and 0.5 V. The first gate dielectric 228 breakdown voltages may be, for example, between 6 V and 8 V. The second gate dielectric 248 breakdown voltages may be, for example, between 4 V and 5 V.

The pass transistor gate dielectric 228 and the programmable transistor 240 gate dielectric 248 may be made of the same material and may have substantially the same thickness. The pass transistor 220 gate dielectric 228 and the programmable transistor 240 gate dielectric 248 may be formed using a dielectric material such as, but not limited to, silicon dioxide ($SiO_2$). Alternatively, the pass transistor gate dielectric 228 and the programmable transistor gate dielectric 248 may also be formed using a high-k dielectric such as, but not limited to, hafnium oxide ($HfO_2$). The pass transistor gate dielectric 228 and the programmable transistor gate dielectric 248 may be deposited using physical vapor deposition (PVD), chemical vapor deposition (CVD), atomic layer deposition (ALD), or any other suitable method of deposition. The pass transistor gate dielectric 228 and the programmable transistor gate dielectric 248 may have thicknesses ranging from 0.5 nm to 2 nm. Other dimensions can be used as will be understood by those skilled in the arts.

Alternatively, the pass transistor gate dielectric 228 and the programmable transistor gate dielectric 248 may include a plurality of dielectric layers. For example, the pass transistor gate dielectric 228 and the programmable transistor gate dielectric 248 may include a layer of silicon dioxide and a layer of hafnium oxide. In the example, the silicon dioxide layer may have a thickness ranging between 0.5 nm and 4 nm, and the hafnium oxide layer may have a thickness ranging between 1 nm and 2 nm.

A combined word line programming line (WL-PL) 260 is electrically connected to the pass transistor gate electrode 222 and the programmable transistor gate electrode 242. A bit line 280 is electrically connected to the pass transistor source region 224. The WL-PL 260 may be electrically connected to the pass transistor gate electrode 222 through a pass transistor contact 230 and to the programmable transistor gate electrode 242 through a programmable transistor contact 250. The bit line 280 may be electrically connected to the pass transistor source region 224 through a pass transistor source region contact 290.

The pass transistor drain region 226 and the programmable transistor source region 244 may be abutting to form a single doped region. The single doped region may be minimum sized as defined by the MDR associated with the CMOS logic foundry technology. Additionally, the spacing between the pass transistor gate electrode 222 and the programmable transistor gate electrode 242 may be minimum spaced as defined by the MDR. The single doped region may be minimum sized and/or the gate electrodes may be minimum spaced, at least in part, because a distinct word line and a distinct programming line typically used by an OTP memory have been merged into the combined word line programming line (WL-PL) 260 in the present embodiment. Alternatively, the pass transistor drain region 226 and the programmable transistor 240 source region 244 may be electrically connected by an interconnect.

The OTP memory 200 may be in a programmed state or an unprogrammed state. During a read operation, the bit line 280, which is electrically floating and pre-discharged, becomes charged if the OTP memory 200 is in a programmed state, while the bit line 280 remains discharged if the OTP memory 200 is in an unprogrammed state. A sense amplifier may be used to detect the potential change in the bit line 280.

Figure 2B:
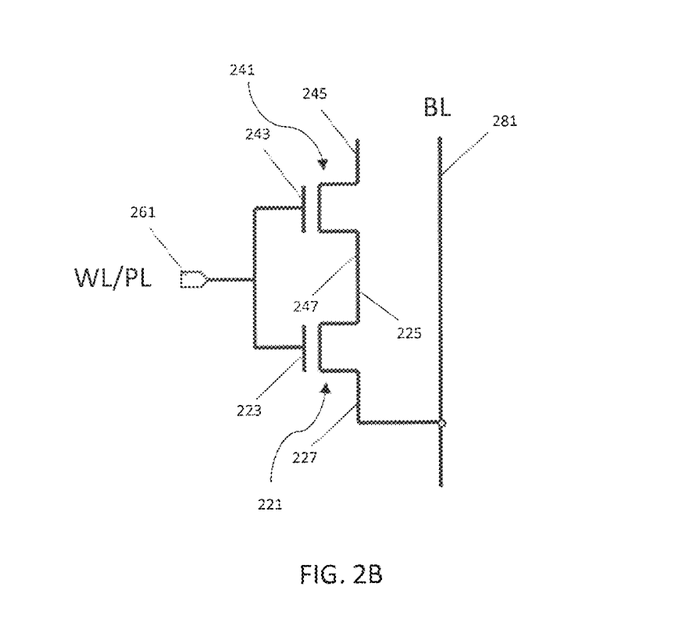
FIG. 2B illustrates a circuit diagram representation of the OTP of FIG. 2A prior to being programmed, in accordance with an embodiment of the present disclosure.

FIG. 2B illustrates a circuit diagram representation of the OTP 200 of FIG. 2A in an unprogrammed state, in accordance with an embodiment of the present disclosure. The circuit of FIG. 2B includes a pass NMOS transistor 221 and a programmable NMOS transistor 241 representative of pass transistor 220 and programmable transistor 240 of FIG. 2A. The pass NMOS transistor 221 includes a gate 223, a source 227, and a drain 225, and the programmable NMOS transistor 241 includes a gate 243, a source 247, and a drain 245. The drain 225 of pass NMOS transistor 221 is electrically connected to the source 247 of programmable NMOS transistor 241, and the source 227 of the pass NMOS transistor 227 is electrically connected to a bit line (BL) 281 that is representative of bit line 280 in FIG. 2A. In other words, the pass NMOS transistor 221 and the programmable NMOS transistor 241 are electrically connected in series as shown in FIG. 2A. The gates 243 and 223 are both connected to a combined word-line/programming-line (WL-PL) 261 that is representative of WL-PL 260, and the drain 245 of the programmable NMOS transistor 241 is electrically floating. In the circuit of FIG. 2B, the potential at the BL 281 does not change substantially as long as the voltage between the combined WL/PL 261 and the BL 281 is less than the breakdown voltage of the programmable NMOS transistor 241.

Figure 2C:
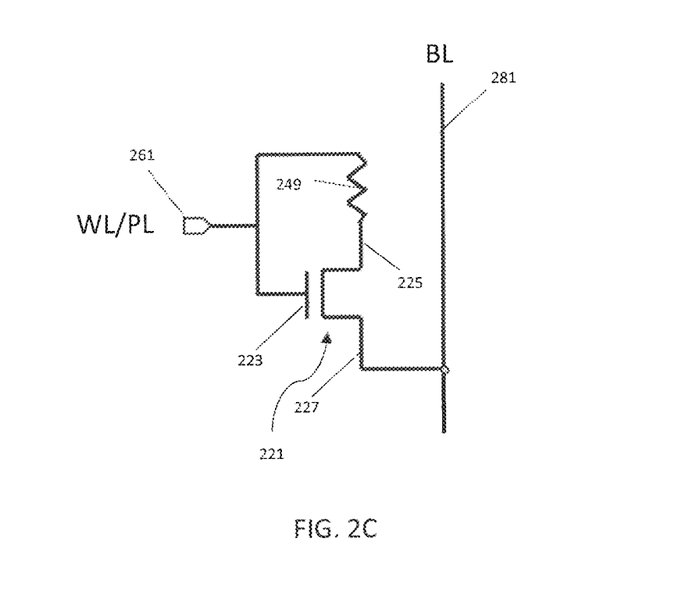
FIG. 2C illustrates the circuit diagram of FIG. 2B after the OTP is programmed, in accordance with an embodiment of the present disclosure.

FIG. 2C illustrates the circuit diagram of FIG. 2B after the OTP 200 is programmed, in accordance with an embodiment of the present disclosure. In the circuit of FIG. 2C, the programmable NMOS transistor 241 has been "blown," and the gate 243 and source 247 of the programmable NMOS transistor 241 are now electrically shorted, but with some resistance. Thus, the programmable NMOS transistor 241 can now be represented as a resistor 249. The drain 225 of the pass NMOS transistor 221 connects to a first end of the resistor 249, and the combined WL-L 261 connects to a second end of the resistor 249 and to the gate 223 of the pass NMOS transistor 221. The programmable NMOS transistor 241 can be "blown" by applying a voltage between the combined WL/PL 261 and the BL 281 that is greater than the breakdown voltage of the programmable NMOS transistor 241 but less than the breakdown voltage of the pass NMOS transistor 221. In the circuit of FIG. 2C, the potential at the BL 281 does not change substantially when the voltage applied between the combined WL/PL 261 and the BL 281 is less than the threshold voltage of the pass NMOS transistor 221. But, when the voltage applied between the combined WL/PL 261 and the BL 281 is greater than the threshold voltage of the pass NMOS transistor 221, the pass NMOS transistor 221 turns on and current flows between the combined WL/PL 261 and the source 227 of the pass NMOS transistor 221 through the resistor 249 so that the current flow charges the BL 281.

Programming Operation on the Exemplary OTP Memory

The OTP memory 200 may be programmed by driving the combined WL-PL 260 to a first potential, such as a first positive DC voltage to provide an example, and by driving the bit line 280 to a second potential, such as a ground potential to provide an example. The first positive DC voltage is greater than the first threshold voltage of the pass transistor 220 and greater than the second breakdown voltage of the programmable transistor 240, but less than the first breakdown voltage of the pass transistor 220. The first positive DC voltage may be, for example, 6 V. The voltage applied to the combined WL-PL 260 may be referred to as a control voltage, or programming voltage during programming operation.

As described above, the WL-PL 260 and the pass transistor gate electrode 222 are electrically connected, and the bit line 280 and the pass transistor source region 224 are electrically connected. Thus, a voltage appears between the pass transistor gate electrode 222 and the pass transistor source region 224. Since this voltage is greater than the first threshold voltage of the pass transistor 220 and less than the first breakdown voltage of the pass transistor 220, the first potential on the pass transistor gate electrode 222 repels hole carriers from a bottom side of the pass transistor gate electrode 222 to form a first channel for electron carriers. As a result of the formed first channel, the pass transistor source region 224 and the programmable transistor source region 244 have substantially the same potential as the second potential (e.g., a ground potential).

As described above, the WL-PL 260 is also electrically connected to the programmable transistor gate electrode 242. Since the programmable transistor source region 244 is driven to a potential substantially the same as the second potential (e.g. ground), a voltage also appears between the programmable transistor gate electrode 242 and the programmable transistor source region 244. And, as noted above, this voltage is greater than the second breakdown voltage of the programmable transistor 240. Thus, the programmable transistor gate dielectric 248 disintegrates or "blows." The OTP memory 200 is considered to be in a programmed state once the programmable transistor gate dielectric 248 is disintegrated or "blown."

In a memory cell with a plurality of columns, another OTP memory sharing the WL-PL 260 may be prevented from being programmed by driving the bit line 280 to a potential that is substantially the same as the first potential (as opposed to the second potential). In other words, adjacent OTP memories can be individually programmed by controlling the bit line voltage, as desired.

Figure 3:
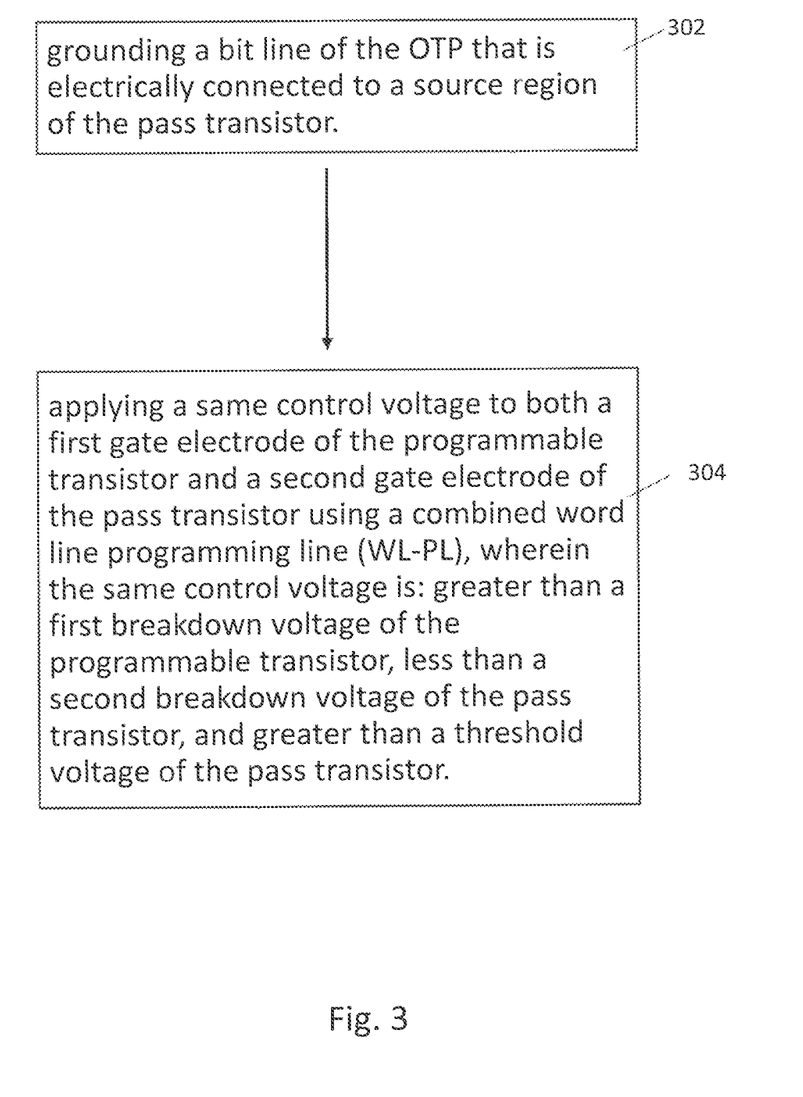
FIG. 3 is a flow diagram of a method of programming an OTP, in accordance with an embodiment of the present disclosure.

FIG. 3 illustrates a flowchart 300 for programming an OTP memory, according to embodiments of the disclosure. For example, the method 300 can be used with the OTP memory 200 illustrated in FIG. 2A. The OTP memory can include a programmable transistor and a pass transistor, such as pass transistor 220 and programmable transistor 240 in the OTP memory 200. In step 302, a bit line of the OTP that is electrically connected to a source region of the pass transistor is grounded. For example, bit line 280 can be grounded. In step 304, a same control voltage is applied to both a first gate electrode of the programmable transistor and a second gate electrode of the pass transistor using a combined word line programming line (WL-PL) such as WL-PL 260; wherein the same control voltage is greater than a first breakdown voltage of the programmable transistor, less than a second breakdown voltage of the pass transistor, and greater than a threshold voltage of the pass transistor.

Read Operation on the Exemplary OTP Memory

The OTP memory 200 may be read by driving the WL-PL 260 to a third potential, such as a second positive DC voltage to provide an example, and pre-discharging the bit line 280 (and the pass transistor 220 source region 224) to be at the second potential, such as a ground potential. The bit line 280 may be electrically floating after it is pre-discharged so that it is initially maintained at the second potential. The second positive DC voltage is greater than the first threshold voltage of the pass transistor 220, but less than the second breakdown voltage of the programmable transistor 240 and less than the first breakdown voltage of the pass transistor 220. The second positive DC voltage may be, for example, 1 V. The voltage applied to the WL-PL 260 may be referred to as a control voltage or read voltage during read operations.

As described above, the WL-PL 260 and the pass transistor gate electrode 222 are electrically connected, and the bit line 280 and the pass transistor source region 224 are electrically connected. Thus, a voltage appears between the pass transistor gate electrode 222 and the pass transistor source region 224. Since this voltage is greater than the first threshold voltage of the pass transistor 220, the third potential on the pass transistor 220 gate electrode 222 repels hole carriers from a bottom side of the pass transistor gate electrode 222 to form a first channel. As a result of the formed first channel, the pass transistor source region 224 and the programmable transistor source region 244 have substantially the same potential as the fourth potential (e.g., a ground potential).

As described above, the WL-PL 260 is also electrically connected to the programmable transistor gate electrode 242, so that the programmable transistor gate electrode 242 is driven to the third potential (e.g., second positive DC voltage.) Thus, a voltage appears between the programmable transistor gate electrode 242 and the programmable transistor 240 source region 244.

When the OTP memory 200 is in an unprogrammed state, a second channel may be formed between the programmable transistor source region 244 and the programmable transistor drain region 246. However, since the programmable transistor drain region 246 is electrically floating, the bit line 280 remains floating also, or in a discharged state, such as ground when pre-discharged to ground.

When the OTP memory 200 is in a programmed state, a resistive path is created between the programmable transistor gate electrode 242 and the programmable transistor source region 244. Thus, current flows between the bit line 280 and the WL-PL 260 through the resistive path and the second channel and begins charging the floating bit line 280. The potential change in the bit line 280 can be sufficiently large for a sensor amplifier connected to the bit line 280 to detect, and therefore determine that the programmable transistor has been programmed to the programmed state.

Figure 4:
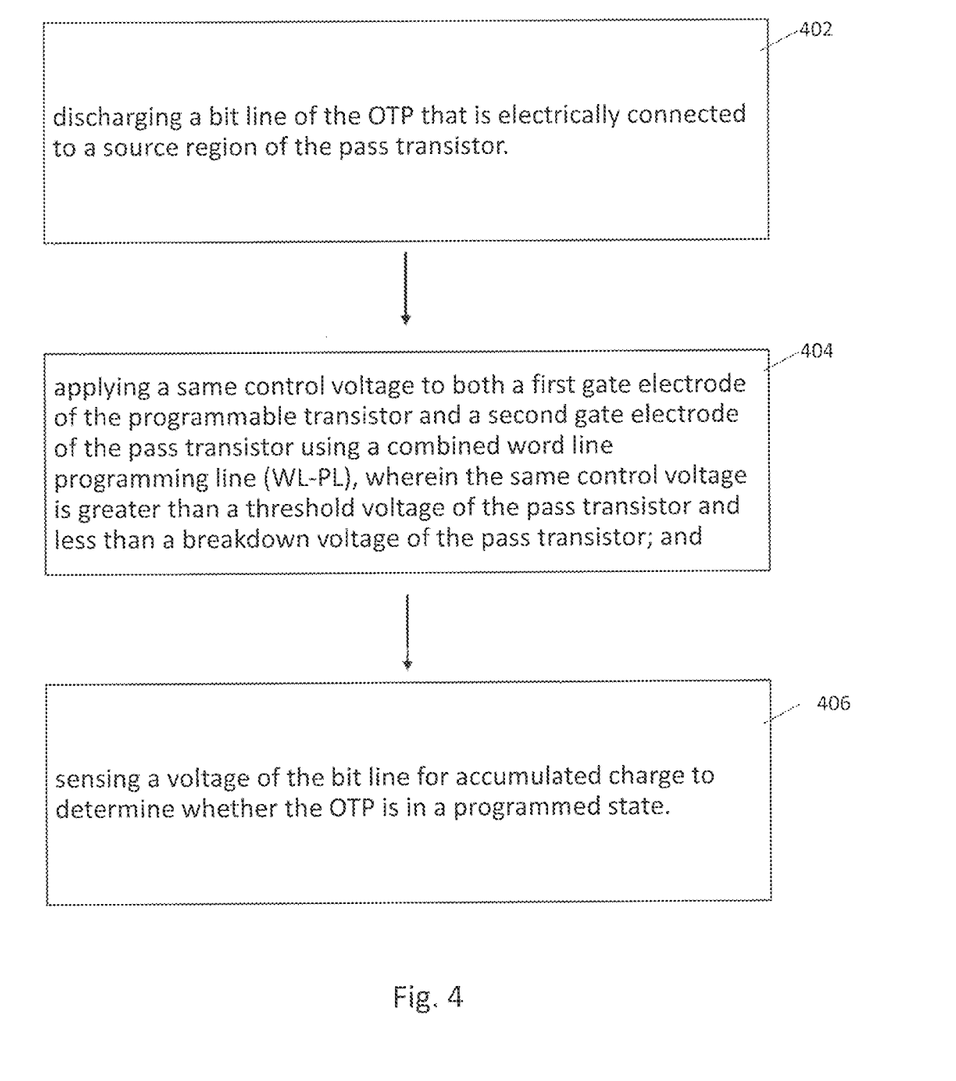
FIG. 4 is a flow diagram of a method of reading an OTP, in accordance with an embodiment of the present disclosure.

FIG. 4 illustrates a flowchart 400 for reading an OTP memory, such as the OTP memory 200 in FIG. 2A, for example. The OTP memory can include a programmable transistor and a pass transistor, such as pass transistor 220 and programmable transistor 240 in the OTP memory 200. In step 402, a bit line of the OTP that is electrically connected to a source region of the pass transistor is discharged. For example, bit line 280 can be discharged. In step 404, a same control voltage is applied to both a first gate electrode of the programmable transistor and a second gate electrode of the pass transistor using a combined WL-PL such as WL-PL 260; wherein the same control voltage is greater than a threshold voltage of the pass transistor and less than a breakdown voltage of the pass transistor. In step 406, a voltage of the bit line is sensed for accumulated charge to determine whether the OTP is in a programmed state. Generally, an accumulated charge would indicate a programmed state, relatively little charge (or no charge) would indicate an unprogrammed state.

Conclusion

The exemplary embodiments described herein are provided for illustrative purposes, and are not limiting. Other exemplary embodiments are possible, and modifications may be made to the exemplary embodiments within the spirit and scope of the disclosure.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments. Further, the claims should be defined only in accordance with their recitations and their equivalents.

What is claimed is:

1. A one-time programmable (OTP) memory, comprising:
    a programmable transistor having a first threshold voltage and a first breakdown voltage, the programmable transistor comprising a first source region, a first drain region, and a first gate electrode;

a pass transistor having a second threshold voltage and a second breakdown voltage, the pass transistor comprising a second source region, a second drain region, and a second gate electrode; and a combined word line programming line (WL-PL) electrically connected to the first gate electrode and the second gate electrode, wherein the first source region is electrically connected to the second drain region and the second source region is electrically connected to a bit line, and wherein a first work function of the first gate electrode is less than a second work function of the second gate electrode.

2. The OTP memory of claim 1, wherein the first source region of the programmable transistor and the second drain region of the pass transistor are abutting to form a single shared source-drain region.

3. The OTP memory of claim 2, wherein the single shared source-drain region is sized according to a minimum design rule (MDR).

4. The OTP memory of claim 1, wherein the second breakdown voltage is greater than the first breakdown voltage and the second threshold voltage is greater than the first threshold voltage.

5. The OTP memory of claim 1, wherein a distance between the first gate electrode of the programmable transistor and the second gate electrode of the pass transistor is determined by a minimum design rule (MDR).

6. The OTP memory of claim 1, wherein the programmable transistor further comprises a first gate dielectric layer and the pass transistor comprises a second gate dielectric layer, and wherein the first and second gate dielectric layers have substantially the same thickness and substantially the same dielectric constant.

7. The OTP memory of claim 6, wherein the first and second gate dielectric layers each comprise a dielectric material selected from the group consisting of silicon dioxide and hafnium oxide.

8. The OTP memory of claim 1, wherein the pass transistor and the programmable transistor are both N-type Metal Oxide Semiconductor (NMOS) transistors.

9. The OTP memory of claim 1, wherein the combined WL-PL is electrically connected to the first gate electrode through a first contact and to the second gate electrode through a second contact.

10. The OTP memory of claim 9, wherein the combined WL-PL is configured to provide a same control voltage to the first gate electrode of the programmable transistor and the second gate electrode of the pass transistor.

11. The OTP memory of claim 1, wherein the first gate electrode comprises a metal selected from the group consisting of titanium aluminum, element aluminum, and an aluminum alloy and the second gate electrode comprises a titanium nitride based metal.

12. A one-time programmable (OTP) memory, comprising:

a programmable transistor having a first threshold voltage and a first breakdown voltage, the programmable transistor comprising a first source region, a first drain region, and a first gate electrode;

a pass transistor having a second threshold voltage and a second breakdown voltage, the pass transistor comprising a second source region, a second drain region, and a second gate electrode; and a combined word line programming line (WL-PL) electrically connected to the first gate electrode and the second gate electrode, wherein the first source region is electrically connected to the second drain region and the second source region is electrically connected to a bit line, wherein a first work function of the first gate electrode is less than a second work function of the second gate electrode, and wherein the second breakdown voltage is greater than the first breakdown voltage.

13. The OTP memory of claim 12, wherein the programmable transistor is programmed by applying a first control voltage to the combined WL-PL relative to the bit line, wherein the first control voltage is: greater than the first breakdown voltage, less than the second breakdown voltage, and greater than the second threshold voltage.

14. The OTP memory of claim 13, wherein the bit line is grounded to program the programmable transistor.

15. The OTP memory of claim 13, wherein a resistive path is formed between the first gate electrode and the first source region when the first control voltage is applied to the combined WL-PL.

16. The OTP memory of claim 13, wherein the programmable transistor is read by applying a second control voltage to the combined WL-PL relative to the bit line, wherein the second control voltage is greater than the second threshold voltage and less than the second breakdown voltage.

17. The OTP memory of claim 16, wherein the bit line is sensed for charge to determine a state of the programmable transistor.

18. The OTP memory of claim 1, wherein:

the first work function is between 4.05 eV and 4.61 eV; and the second work function is between 4.61 eV and 5.17 eV.

19. A method of programming a one-time programmable memory (OTP), the OTP including a programmable transistor and a pass transistor, comprising:

grounding a bit line of the OTP that is electrically connected to a source region of the pass transistor; and applying a same control voltage to both a first gate electrode of the programmable transistor and a second gate electrode of the pass transistor using a combined word line programming line (WL-PL), wherein the same control voltage is: greater than a first breakdown voltage of the programmable transistor, less than a second breakdown voltage of the pass transistor, and greater than a threshold voltage of the pass transistor.

20. A method of reading a one-time programmable memory (OTP), the OTP including a programmable transistor and a pass transistor, comprising:

discharging a bit line of the OTP that is electrically connected to a source region of the pass transistor;

applying a same control voltage to both a first gate electrode of the programmable transistor and a second gate electrode of the pass transistor using a combined word line programming line (WL-PL), wherein the same control voltage is greater than a threshold voltage of the pass transistor and less than a breakdown voltage of the pass transistor; and sensing a voltage of the bit line for accumulated charge to determine whether the OTP is in a programmed state.

21. The OTP memory of claim 1, further comprising a gate dielectric coupled to the gate electrode, wherein the gate dielectric is at least partially disintegrated when the OTP memory is in a programmed state so that current can flow from the gate electrode to the first source region in the programmed state.

22. The OTP memory of claim 12, further comprising a gate dielectric coupled to the gate electrode, wherein the gate dielectric is at least partially disintegrated when the OTP memory is in a programmed state so that current can flow from the gate electrode to the first source region in the programmed state.

* * * * *